United States Patent
Onuma et al.

(10) Patent No.: US 10,128,818 B2
(45) Date of Patent: Nov. 13, 2018

(54) DATA PROCESSOR, DATA PROCESSING METHOD AND COMMUNICATION DEVICE

(71) Applicants: NTT ELECTRONICS CORPORATION, Yokohama-shi, Kanagawa (JP); NIPPON TELEGRAPH AND TELEPHONE CORPORATION, Tokyo (JP)

(72) Inventors: Yasuharu Onuma, Kanagawa (JP); Etsushi Yamazaki, Kanagawa (JP); Kazuhito Takei, Kanagawa (JP); Osamu Ishida, Kanagawa (JP); Kengo Horikoshi, Kanagawa (JP); Mitsuteru Yoshida, Kanagawa (JP); Yoshiaki Kisaka, Kanagawa (JP); Masahito Tomizawa, Kanagawa (JP)

(73) Assignees: NTT ELECTRONICS CORPORATION, Yokohama (JP); NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/553,909

(22) PCT Filed: Jan. 16, 2017

(86) PCT No.: PCT/JP2017/001195
§ 371 (c)(1),
(2) Date: Aug. 25, 2017

(87) PCT Pub. No.: WO2017/154350
PCT Pub. Date: Sep. 14, 2017

(65) Prior Publication Data
US 2018/0175830 A1  Jun. 21, 2018

(30) Foreign Application Priority Data
Mar. 8, 2016 (JP) ................. 2016-044777

(51) Int. Cl.
*H04L 7/00* (2006.01)
*H03H 17/02* (2006.01)

(52) U.S. Cl.
CPC .... *H03H 17/0227* (2013.01); *H03H 17/0213* (2013.01); *H04L 7/0087* (2013.01);
(Continued)

(58) Field of Classification Search
CPC ...... H04L 7/0337; H04L 7/0334; H03M 9/10; H03M 13/1575; H03M 13/52; H03L 7/07; H03L 7/0807
(Continued)

(56) References Cited

U.S. PATENT DOCUMENTS 7,590,168 B2  9/2009 Raghavan et al.
2006/0120496 A1* 6/2006 Okamura ................. H03L 7/07
375/355
(Continued)

FOREIGN PATENT DOCUMENTS

EP  0 557 974 A1  9/1993
JP  2014-183414 A  9/2014

OTHER PUBLICATIONS

Canadian Office Action, Canadian Patent Application No. 2,977,865 dated Jun. 26, 2018.

*Primary Examiner* — Khai Tran
(74) *Attorney, Agent, or Firm* — Arent Fox LLP

(57) ABSTRACT

A parallel transfer rate converter inputs first parallel data with number of samples being S1 pieces in synchronism with a first clock, and outputs second parallel data with number of samples being S2=S1×(m/p) pieces (p is an integer equal to or larger than 1) in synchronism with a second clock having a frequency which is p/m times of a frequency of the first clock. A convolution operation device inputs the second parallel data in synchronism with the second clock, generates third parallel data with number of samples being S3=S2×(n/m) pieces (S3 is an integer equal to or larger than 1) by executing a convolution operation with a coefficient indicating a transmission characteristic to the second parallel data, and outputs the third parallel data in synchronism with the second clock.

10 Claims, 7 Drawing Sheets

(52) U.S. Cl.
CPC ............... *H03H 2017/0214* (2013.01); *H03H 2017/0245* (2013.01); *H03H 2017/0298* (2013.01); *H04L 7/0029* (2013.01)

(58) Field of Classification Search
USPC ......... 375/355, 354, 371; 341/156; 327/147, 327/157
See application file for complete search history.

(56) References Cited

U.S. PATENT DOCUMENTS

| | | | |
|---|---|---|---|
| 2007/0229342 A1* | 10/2007 | Baba .................... | H03K 5/135 341/156 |
| 2011/0064176 A1* | 3/2011 | Takada .................... | H03L 7/07 375/355 |
| 2015/0098526 A1 | 4/2015 | Hind et al. | |

* cited by examiner

DATA PROCESSOR, DATA PROCESSING METHOD AND COMMUNICATION DEVICE

CROSS-REFERENCE TO RELATED APPLICATIONS

This application is a National Stage entry of International Application No. PCT/JP2017/001195, filed Jan. 16, 2017, which claims priority to Japanese Patent Application No. 2016-044777, filed Mar. 8, 2016. The disclosures of the priority applications are incorporated in their entirety herein by reference.

FIELD

The present invention relates to a data processor, a data processing method and a communication device.

BACKGROUND

In a high speed communication device, a data processor that converts a sampling rate is used (for example, see PTL 1). In a conventional data processor, in the case of converting the sampling rate to n/m times (n and m are integers equal to or larger than 1), first, a filter part performs interpolation by inserting zero data between respective samples of input data and obtains data of n times. Next, a sampling part thins the data from the data of n times to the data of 1/m times.

CITATION LIST

Patent Literature

[PTL 1] JP 2014-183414 A

SUMMARY

Technical Problem

In a conventional data processor, data that is n times input data is obtained. Therefore, since the data not used as output data is also calculated, power consumption is large, and a circuit configuration is complicated. In addition, since input of serial data is assumed, a processing speed is low, and processing to parallel data is not taken into consideration.

The present invention is implemented to solve the problem described above, and an object is to provide a data processor, a data processing method and a communication device capable of reducing power consumption, simplifying a circuit configuration and accelerating processing.

Solution to Problem

A data processor according to the present invention converting a sampling rate to n/m times (n and m are integers equal to or larger than 1), includes: a parallel transfer rate converter inputting first parallel data with number of samples being S1 pieces in synchronism with a first clock, and outputting second parallel data with number of samples being S2=S1×(m/p) pieces (p is an integer equal to or larger than 1) in synchronism with a second clock having a frequency which is p/m times of a frequency of the first clock; and a convolution operation device inputting the second parallel data in synchronism with the second clock, generating third parallel data with number of samples being S3=S2×(n/m) pieces (S3 is an integer equal to or larger than 1) by executing a convolution operation with a coefficient indicating a transmission characteristic to the second parallel data, and outputting the third parallel data in synchronism with the second clock.

Advantageous Effects of Invention

The present invention makes it possible to reduce power consumption, simplify a circuit configuration and accelerate processing.

DESCRIPTION OF EMBODIMENTS

A data processor, a data processing method and a communication device according to the embodiments of the present invention will be described with reference to the drawings. The same components will be denoted by the same symbols, and the repeated description thereof may be omitted.

Embodiment 1

Figure 1:
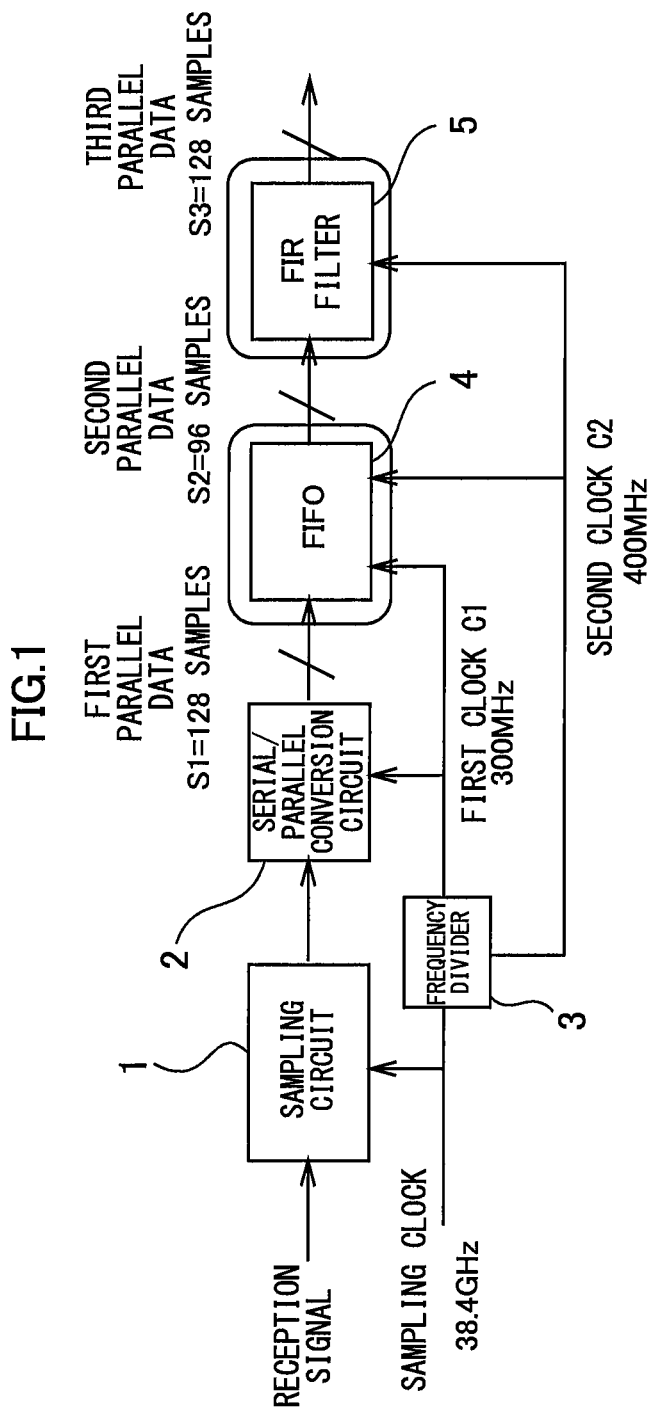
FIG. 1 is a diagram illustrating a data processor relating to the embodiment 1 of the present invention.
Figure 2:
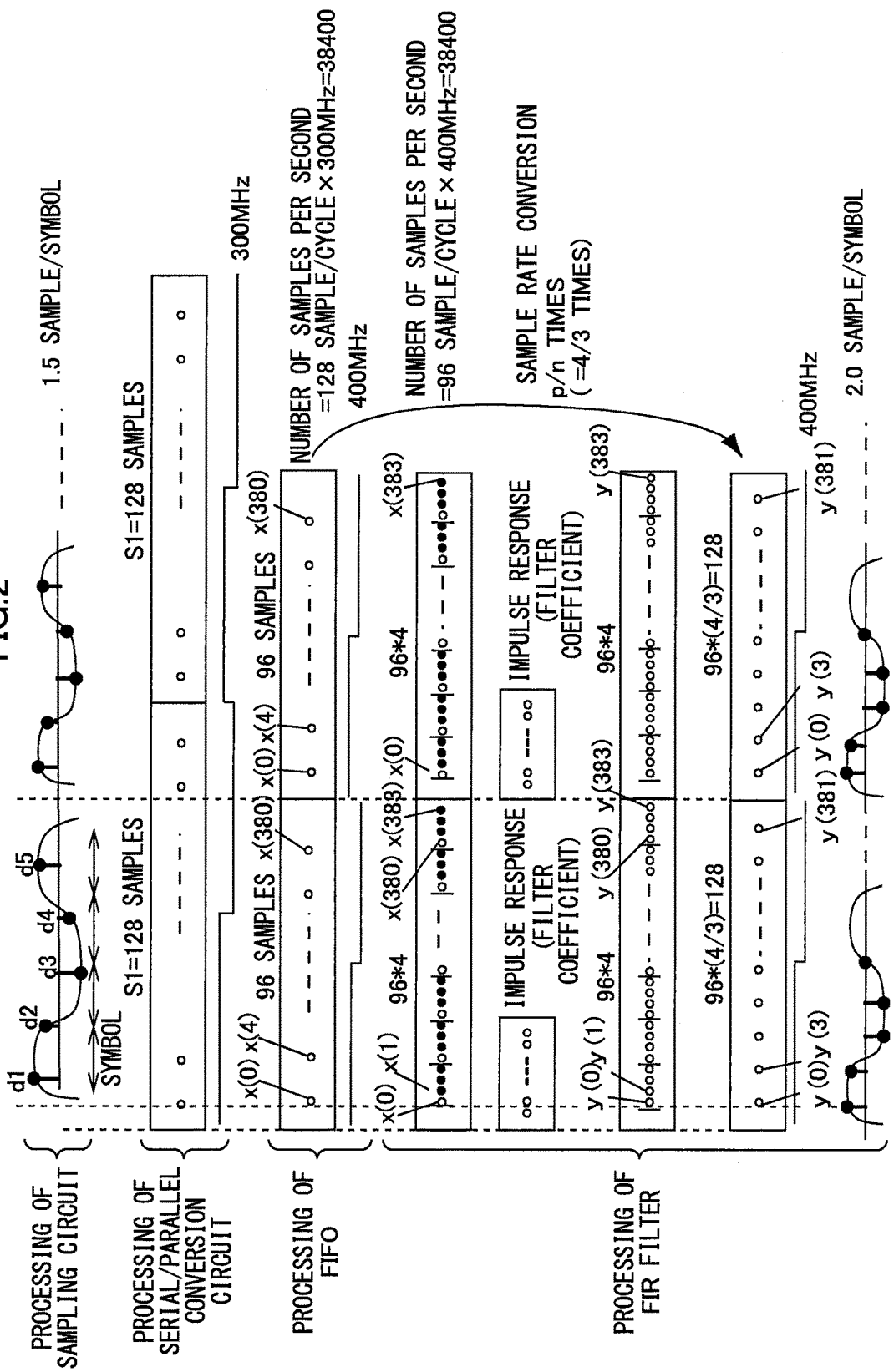
FIG. 2 is a diagram for describing processing of respective configurations included in the data processor relating to the embodiment 1 of the present invention.

FIG. 1 is a diagram illustrating a data processor relating to the embodiment 1 of the present invention. FIG. 2 is a diagram for describing processing of respective configurations included in the data processor relating to the embodiment 1 of the present invention. The data processor is a device that converts a sampling rate to n/m times (n and m are integers equal to or larger than 1). Here, it is n/m=4/3, and data sampled by 1.5 sample/symbol is upsampled to 2.0 samples/symbol.

A sampling circuit 1 samples a reception signal which is a high-frequency analog electric signal in synchronism with a sampling clock of 38.4 GHz. A serial/parallel conversion circuit 2 converts the sampled serial data to parallel data. The serial/parallel conversion circuit 2 outputs first parallel data in synchronism with a first clock C1. Note that a frequency divider 3 frequency-divides the sampling clock of 38.4 GHz and generates the first clock C1 of 300 MHz and a second clock C2 of 400 MHz.

The sampling circuit 1 executes sampling by 1.5 sample/symbol. A symbol is a unit of the multiplexed digital data when modulating a high frequency signal by digital data. The serial/parallel conversion circuit 2 generates first parallel data (d1, d2, . . . , ds1) with the number of samples being S1 pieces. Here, S1 is 128 pieces.

A FIFO 4 (means "a parallel transfer rate converter") inputs the first parallel data with the number of the samples being S1 pieces in synchronism with the first clock C1, and outputs second parallel data (d1, d2, . . . , ds2) with the number of the samples being S2=S×(m/p) pieces (p is an integer equal to or larger than 1) in synchronism with the second clock C2 of a frequency of p/m times of the first clock C1. Here, it is p=4, and S2=128×(3/4)=96. A cycle of the second clock C2 is 300 MHz×4/3=400 MHz. S1 is a number that can be divided by p.

Thus, the FIFO 4 inputs the first parallel data with the number of the samples being 128 pieces in synchronism with the first clock C1 of 300 MHz, and outputs the second parallel data with the number of the samples being 96 pieces in synchronism with the second clock of 400 MHz. However, S1×C1=S2×C2 is maintained and S2×n is set to be a multiple of m. Here, it is 128×300 MHz=96×400 MHz, and S2×n=96×4 is set to the multiple of m=3.

A FIR filter 5 (means "a convolution operation device") inputs the second parallel data in synchronism with the second clock C2, generates third parallel data with the number of the samples being S3=S2×(n/m) pieces (S3 is an integer equal to or larger than 1) by executing a convolution operation with a coefficient indicating a transmission characteristic to the second parallel data, and outputs the third parallel data in synchronism with the second clock C2. Here, the number of the samples of the third parallel data is S3=96×(4/3)=128. Therefore, the FIR filter 5 inputs the second parallel data with the number of the samples being 96 pieces, and outputs the third parallel data with the number of the samples being 128 pieces in synchronism with the clock of 400 MHz. As a result, the sampling rate is upsampled (resampled) to be 4/3 times from 1.5 sample/symbol to 2 samples/symbol.

Here, the FIR filter is generally calculated by convolution of an impulse response h(n) indicating a filter coefficient and an input data string x(n) as below. N1 is the number of the data of x(n), and N2 is the number of the data of the impulse response h(n). In the case that N2/2 cannot be divided, a fraction after a decimal point is rounded off.

[Math. 1]

$$y(n) = x(n) * h(n) = \sum_{k=0}^{N-1} x(k) \cdot h(n-k) = \sum_{k=0}^{N1+N2-1} x(k) \cdot h(n-k) = \sum_{k=0-N2/2}^{N1+N2/2-1} x(k) \cdot h(n-k)$$

An operation performed in the FIR filter 5 in the present embodiment will be described. Three pieces of zero data are inserted between the respective samples of the inputted parallel data with the number of the samples being 96 pieces, thus interpolation is performed. The data is expressed by x(0) to x(383). In addition, the impulse response h(n) is calculated in a range of h(−7) to h(7) in the FIR filter of 15 stages. In this case, the convolution operation is an expression below. Note that a multiplication result with the zero data inserted between the respective samples also becomes zero. Therefore, it is x(1)h(n−1)=x(2)h(n−2)=x(3)h(n−3)=0, for example. Note that $x_2(k)$ is an input data string of the next parallel data.

[Math. 2]

$$y(n) = x(n) * h(n) = \sum_{k=0}^{N-1} x(k) \cdot h(n-k) = \sum_{k=0-7}^{96*4+7-1} x(k) \cdot h(n-k)$$
$$= x(-7)h(n+7)\ldots x(-4)h(n-4)\ldots + x(0)h(n-0) +$$
$$x(1)h(n-1) + x(2)h(n-2) + x(3)h(n-3) + x(4)$$
$$h(n-4)\ldots + x(384)h(n-384)\ldots + x(390)h(n-390)$$

A data string after filtering of the interpolated parallel data is expressed as below.

[Math. 3]

$$y(n)=x(-4)h(n+4)+x(0)h(n)+x(4)h(n-4)\ldots +$$
$$x(380)h(n-380)+x_2(384)h(n-384)+$$
$$x_2(388)h(n-388)$$

When the data string after the filtering of the interpolated parallel data is thinned by every m=3, it is expressed as below.

[Math. 4]

$$y(0)=x(-4)h(4)+x(0)h(0)+x(4)h(-4)$$

$$y(3)=x(-4)h(7)+x(0)h(3)+x(4)h(-1)+x(8)h(-5)$$

$$y(6)=x(0)h(6)+x(4)h(2)+x(8)h(-2)+x(12)h(-6)$$

$$y(9)=x(4)h(5)+x(8)h(1)+x(12)h(-3)+x(16)h(-7)$$

$$y(12)=x(8)h(4)+x(12)h(0)+x(16)h(-4)$$

$$y(15)=x(8)h(7)+x(12)h(3)+x(16)h(-1)+x(20)h(-5)$$

$$y(18)=x(12)h(6)+x(16)h(2)+x(20)h(-2)+x(24)h(-6)$$

$$y(21)=x(16)h(5)+x(20)h(1)+x(24)h(-3)+x(28)h(-7)$$

$$y(24)=x(20)h(4)+x(24)h(0)+x(28)h(-4)$$

$$y(27)=x(20)h(7)+x(24)h(3)+x(28)h(-1)+x(32)h(-5)$$

.

.

.

$$y(378)=x(372)h(6)+x(376)h(2)+x(380)h(-2)+x(0)h(-6)$$

$$y(381)=x(376)h(5)+x(380)h(1)+x(0)h(-3)+x(4)h(-7)$$

$$y(0)=x(380)h(4)+x(0)h(0)+x(4)h(-4)$$

$$y(3)=x(380)h(7)+x(0)h(3)+x(4)h(-1)+x(8)h(-5)$$

$$y(6)=x(0)h(6)+x(4)h(2)+x(8)h(-2)+x(12)h(-6)$$

.

.

.

Figure 3:
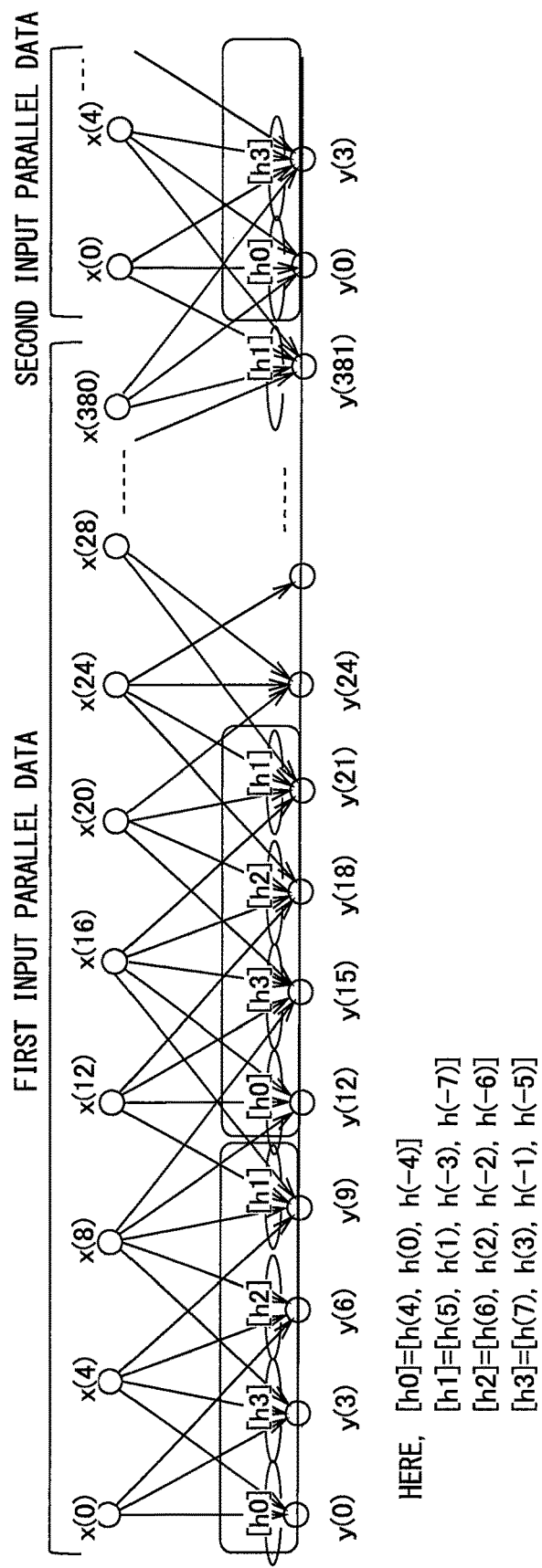
FIG. 3 is a diagram illustrating a relation between input parallel data and output parallel data of the FIR filter relating to the embodiment 1 of the present invention.

FIG. 3 is a diagram illustrating a relation between input parallel data and output parallel data of the FIR filter relating to the embodiment 1 of the present invention. For first input parallel data, a sequence [h0], [h3], [h2], [h1] of the impulse response is repeatedly calculated in order from y(0). In addition, also for second input parallel data, the sequence [h0], [h3], [h2], [h1] of the impulse response is repeatedly calculated in order from y(0). It is similar for the succeeding input parallel data. In this way, a calculation expression can be fixed for the input parallel data. It is because that the number of the samples of the input parallel data is set to a value which can fix the calculation expression of the convolution operation by the FIFO 4 of a preceding stage, before performing the convolution operation in the FIR filter 5.

In addition, the convolution operation in the FIR filter 5 corresponds to processing of thinning by every m and executing the convolution operation of the data interpolated by inserting (n−1) pieces of the zero data between the respective samples of the second parallel data and the filter coefficient. The filter coefficient is a finite impulse response. While the zero data is virtually inserted in interpolation processing, since the interpolation and thinning are simultaneously performed in actual calculation and a value after the thinning can be directly calculated, it is not needed to perform calculation for interpolated n times.

As described above, in the present embodiment, the first parallel data with the number of the samples being S1 pieces synchronized with the first clock C1 is converted to the second parallel data with the number of the samples being S2=S1×(m/p) pieces synchronized with the second clock C2 of the frequency of p/m times of the first clock C1, the convolution operation with the coefficient indicating the transmission characteristic is executed to the second parallel data, and the third parallel data with the number of the samples being S3=S2×(n/m) pieces is generated. Thus, the sampling rate can be converted to n/m times.

In addition, in the present embodiment, without obtaining the data of n times and then thinning the data to 1/m times as in a conventional technology, the third parallel data is directly calculated from the second parallel data by the convolution operation. Therefore, power consumption can be reduced, a circuit configuration can be simplified, and the processing can be accelerated.

Figure 4:
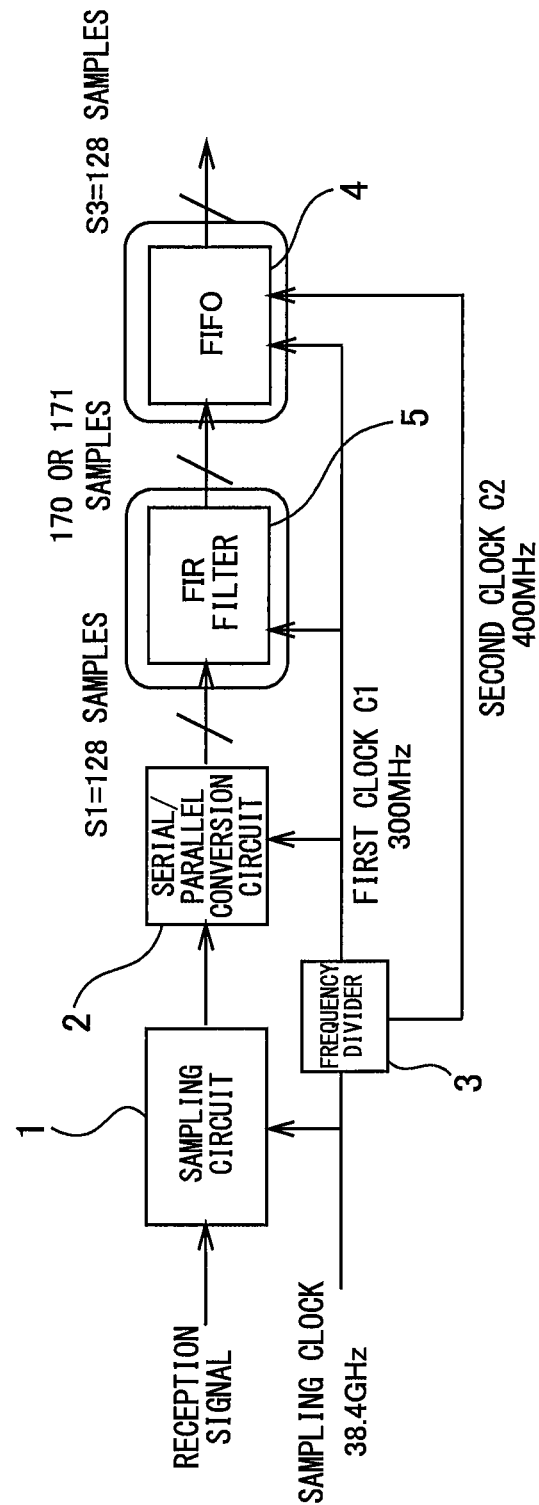
FIG. 4 is a diagram illustrating a data processor relating to the comparative example.

Subsequently, an effect by providing the FIR filter 5 in a subsequent stage of the FIFO 4 will be described in comparison with a comparative example in the present embodiment. FIG. 4 is a diagram illustrating a data processor relating to the comparative example. An arrangement of the FIR filter 5 and the FIFO 4 is opposite to that of the embodiment 1.

The FIR filter 5 in the comparative example inputs the parallel data with the number of the samples being 128 pieces, and outputs the parallel data with the number of the samples being 171 or 170 pieces in synchronism with the clock of 300 MHz. The FIFO 4 converts the data to the parallel data with the number of the samples being 128 pieces in synchronism with the clock of 400 MHz.

An operation performed in the FIR filter 5 in the comparative example will be described. Three pieces of the zero data are inserted between the respective samples of the inputted parallel data with the number of the samples being 128 pieces, and the interpolation is performed. The data is expressed by x(0) to x(511). Other setting is similar to that of the embodiment 1. In this case, the convolution operation is an expression below.

[Math. 5]

$$y(n) = x(n) * h(n) = \sum_{k=0}^{N-1} x(k) \cdot h(n-k) = \sum_{k=0-7}^{128*4+7-1} x(k) \cdot h(n-k)$$

$$= x(-7)h(n+7) \ldots x(-4)h(n-4) \ldots + x(0)h(n-0) + x(1)$$

$$h(n-1) + x(2)h(n-2) + x(3)h(n-3) + x(4)h(n-4) \ldots +$$

$$x(512)h(n-512) \ldots + x(518)h(n-518)$$

$$= x(-4)h(n+4) + x(0)h(n) + x(4)h(n-4) \ldots + x(508)$$

$$h(n-508) + x_2(512)h(n-512) + x_2(516)h(n-516)$$

When the data string after the filtering of the interpolated parallel data is thinned by every m=3, it is expressed as below.

[Math. 6]

$$y(0)=x(-4)h(4)+x(0)h(0)+x(4)h(-4)$$

$$y(3)=x(-4)h(7)+x(0)h(3)+x(4)h(-1)+x(8)h(-5)$$

$$y(6)=x(0)h(6)+x(4)h(2)+x(8)h(-2)+x(12)h(-6)$$

$$y(9)=x(4)h(5)+x(8)h(1)+x(12)h(-3)+x(16)h(-7)$$

$$y(12)=x(8)h(4)+x(12)h(0)+x(16)h(-4)$$

$$y(15)=x(8)h(7)+x(12)h(3)+x(16)h(-1)+x(20)h(-5)$$

$$y(18)=x(12)h(6)+x(16)h(2)+x(20)h(-2)+x(24)h(-6)$$

$$y(21)=x(16)h(5)+x(20)h(1)+x(24)h(-3)+x(28)h(-7)$$

$$y(24)=x(20)h(4)+x(24)h(0)+x(28)h(-4)$$

$$y(27)=x(20)h(7)+x(24)h(3)+x(28)h(-1)+x(32)h(-5)$$

.

.

.

$$y(507)=x(502)h(7)+x(504)h(3)+x(508)h(-1)+x(512)h(-5)$$

$$y(510)=x(504)h(6)+x(508)h(2)+x(0)h(-2)+x(4)h(-6)$$

$$y(1)=x(-508)h(5)+x(0)h(1)+x(4)h(-3)+x(8)h(-7)$$

$$y(4)=x(0)h(4)+x(4)h(0)+x(8)h(-4)$$

$$y(7)=x(0)h(7)+x(4)h(3)+x(8)h(-1)+x(12)h(-5)$$

Figure 5:
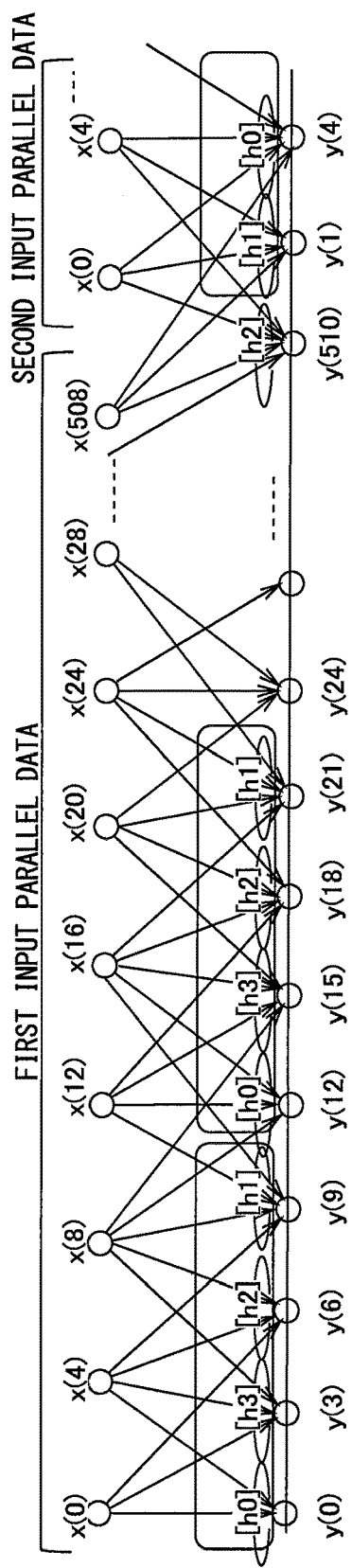
FIG. 5 is a diagram illustrating a relation between input parallel data and output parallel data of the FIR filter relating to the comparative example.

FIG. 5 is a diagram illustrating a relation between input parallel data and output parallel data of the FIR filter relating to the comparative example. For the first parallel data input, a sequence [h0], [h3], [h2], [h1] of the impulse response is repeatedly calculated in order from y(0). For the second parallel data input, a sequence [h1], [h0], [h3], [h2] of the impulse response are repeatedly calculated in order from y(1). Also for the succeeding parallel data input, the calculation expression is not fixed for the parallel data input. Even in the comparative example, there is a case that the calculation expression can be fixed when the sample rate and the parallel data are selected. However, a settable value is limited and a range of a design is narrow.

In contrast, in the case of providing the FIR filter 5 in the subsequent stage of the FIFO 4 as in the present embodiment, for an arbitrary multiple (n/m), n times of the number S2 of the samples of the parallel data to be inputted to the FIR filter 5 can be turned to the multiple of m. Thus, since the calculation expression of the FIR filter 5 can be fixed, flexibility of the design becomes wider than in the comparative example. Further, since it is not needed to switch by switching or rotate a parameter group, the circuit configuration of the FIR filter 5 can be simplified, arithmetic processing can be performed at a high speed, and it is useful for accelerating a transmission rate. In addition, since extra processing is not needed, it is also effective in power consumption reduction.

Furthermore, the convolution operation in the FIR filter 5 corresponds to the processing of thinning by every m and executing the convolution operation of the data interpolated by inserting (n−1) pieces of the zero data between the respective samples of the second parallel data and the filter coefficient. The filter coefficient is the finite impulse response. Thus, the configuration of the convolution operation device can be simplified, and the convolution operation can be calculated at a high speed.

In addition, it is preferable that each of S1 and S3 is a power of 2. Since a general purpose memory used in the FIFO 4 and the FIR filter 5 is often configured by the power of 2, the processing becomes easy. Further, it is preferable that it is S1=S3. Thus, since the same memory can be shared by the FIFO 4 and the FIR filter 5, a circuit design becomes easy.

Embodiment 2

In the first embodiment 1, the filter coefficient of the FIR filter 5 is set as the coefficient for the interpolation processing. In contrast, in the present embodiment, the filter coefficient of the FIR filter 5 is shared with the filter coefficient for compensating distortion in a transmission line of data, for example a frequency characteristic of transmission delay. For example, the filter coefficient is a transmission function of group delay compensation that minimizes group delay. Without being limited to this, the filter coefficient may be shared with the filter coefficient for compensating various kinds of propagation characteristics of optical communication. By sharing the filter coefficient with the filter coefficient for compensating the propagation characteristics in this way, the circuit configuration is simplified, and high-speed processing becomes possible. In addition, by mutually independently setting divided filter coefficient groups [h0], [h1], [h2], [h3], compensation can be performed with higher accuracy.

Embodiment 3

Figure 6:
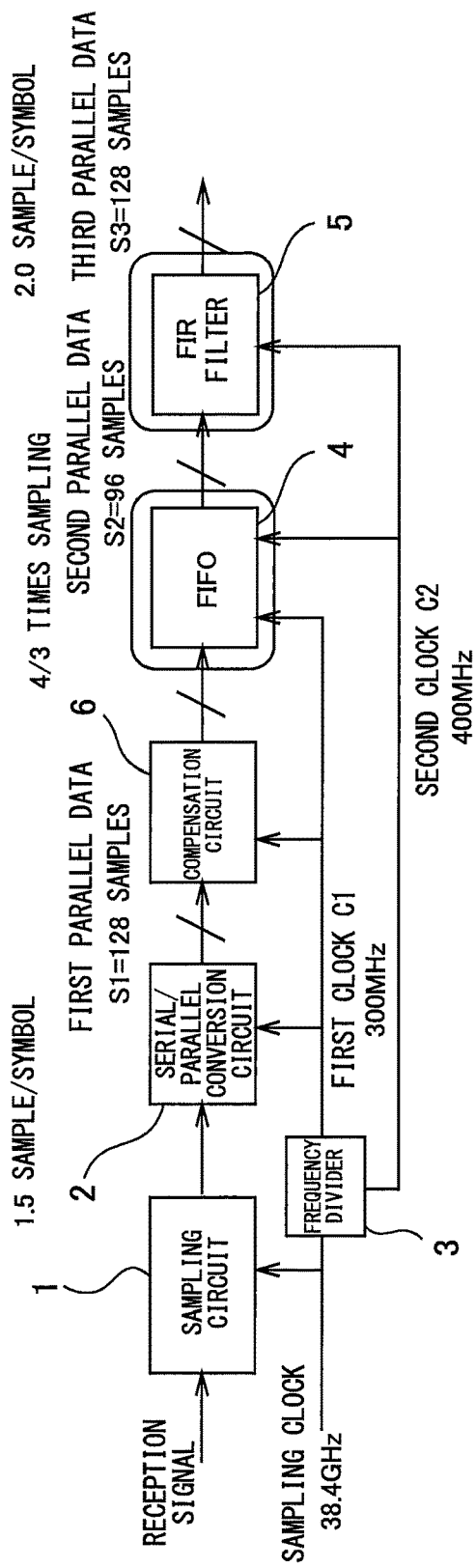
FIG. 6 is a diagram illustrating a data processor relating to the embodiment 3 of the present invention.

FIG. 6 is a diagram illustrating a data processor relating to the embodiment 3 of the present invention. A compensation circuit 6 is provided between the serial/parallel conversion circuit 2 and the FIFO 4. The compensation circuit 6 performs the compensation of the distortion such as chromatic dispersion compensation for the parallel data of 1.5 sample/symbol. Thereafter, the FIFO 4 and the FIR filter 5 perform upsampling (resampling) to 2 samples/symbol (that is, n/m is larger than 1).

Thus, the power consumption needed for the processing of the compensation circuit 6 can be reduced compared to the processing of the parallel data of 2 samples/symbol by the compensation circuit 6. In particular, it is greatly effective in the case that for the processing of the compensation circuit 6, a large amount of the processing is performed such as performing transformation to a frequency domain by FFT (Fast Fourier Transform) processing once, performing compensation processing of multiplying the transmission function or the like there, and returning to a time domain by IFFT (Inverse Fast Fourier Transform) again, as compared to the FIR filter condifuration.

Note that, considering a sampling theorem, 2 samples/symbol or more is generally needed for the processing of the compensation circuit 6, and it is conceivable that waveform degradation occurs with 1.5 sample/symbol. However, the present embodiment is effective in the case that the power consumption reduction is more important compared to the waveform degradation. In addition, for the power consumption reduction, it is advantageous to reduce the number of the samples per symbol and perform the processing, however, the waveform degradation becomes large. Therefore, 1.5 sample/symbol is practical.

Embodiment 4

Figure 7:
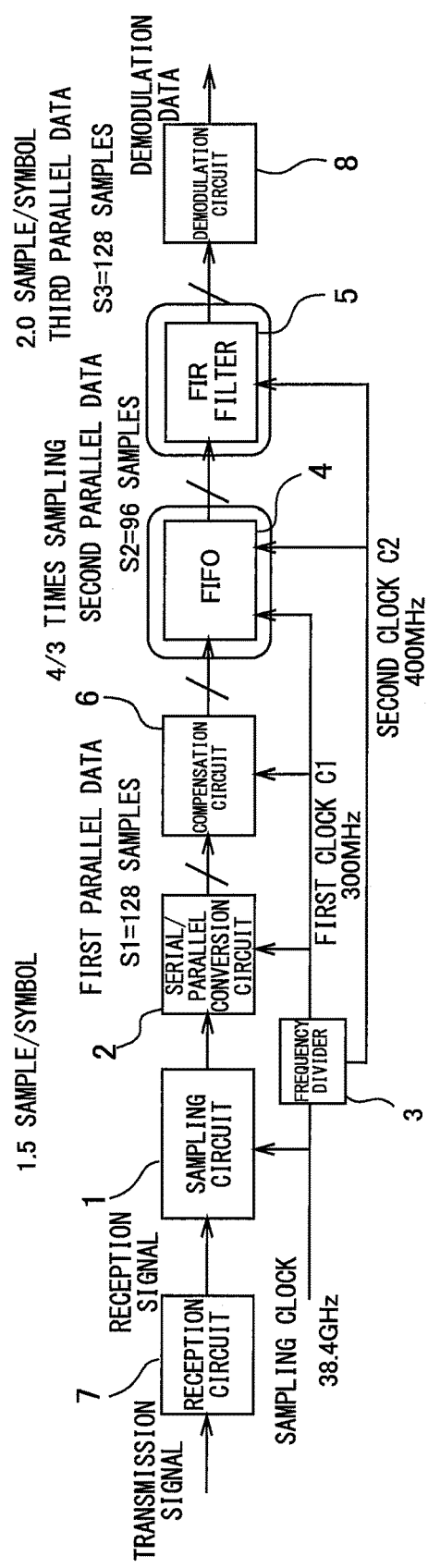
FIG. 7 is a diagram illustrating a communication device relating to the embodiment 4 of the present invention.

FIG. 7 is a diagram illustrating a communication device relating to the embodiment 4 of the present invention. The communication device is an optical communication device or a wireless communication device that receives and demodulates an optical or wireless transmission signal. A reception circuit 7 receives the transmission signal, converts it to an analog electric signal and outputs it as a reception signal. The configuration from the sampling circuit 1 to the FIR filter 5 and the processing method are similar to that of the embodiments 1-3. A demodulation circuit 8 demodulates an output signal of the FIR filter 5, and outputs demodulation data. In this way, the present invention is applicable to the optical communication device or the wireless communication device.

Note that the processing from the sampling circuit 1 to the FIR filter 5 may be performed by recording a program for realizing a function of the data processor in the embodiments 1-3 in a computer-readable recording medium, making a computer system or a programmable logic device read the program recorded in the recording medium, and executing it. Note that the "computer system" here includes an OS and hardware such as a peripheral device or the like. In addition, the "computer system" also includes a WWW system including a homepage providing environment (or display environment). Furthermore, the "computer-readable recording medium" is a portable medium such as a flexible disk, a magneto-optical disk, a ROM or a CD-ROM, or a storage device such as a hard disk built in the computer system. Further, the "computer-readable recording medium" also includes the one holding the program for a fixed period of time, such as a volatile memory (RAM) inside the computer system to be a server or a client in the case that the program is transmitted through a network such as the Internet or a communication channel such as a telephone line. In addition, the program may be transmitted from the computer system storing the program in the storage device or the like to another computer system through a transmission medium or a transmission wave in the transmission medium. Here, the "transmission medium" that transmits the program is a medium having a function of transmitting information like the network (communication network) such as the Internet or the communication channel (communication line) such as the telephone line. Furthermore, the program may be the one for realizing a part of the above-described function. Further, it may be the one capable of realizing the above-described function by a combination with the program already recorded in the computer system, that is, a so-called difference file (difference program).

REFERENCE SIGNS LIST

1 sampling circuit; 2 serial/parallel conversion circuit; 4 FIFO (parallel transfer rate converter); 5 FIR filter (convolution operation device); 6 compensation circuit; 7 reception circuit; 8 demodulation circuit

The invention claimed is:

1. A data processor converting a sampling rate to n/m times (n and m are integers equal to or larger than 1), comprising:

a parallel transfer rate converter inputting first parallel data with number of samples being S1 pieces in synchronism with a first clock, and outputting second parallel data with number of samples being S2=S1×(m/p) pieces (p is an integer equal to or larger than 1) in synchronism with a second clock having a frequency which is p/m times of a frequency of the first clock; and a convolution operation device inputting the second parallel data in synchronism with the second clock, generating third parallel data with number of samples being S3=S2×(n/m) pieces (S3 is an integer equal to or larger than 1) by executing a convolution operation with a coefficient indicating a transmission characteristic to the second parallel data, and outputting the third parallel data in synchronism with the second clock.

2. The data processor according to claim 1, wherein n times of S2 is a multiple of m.

3. The data processor according to claim 1, wherein the convolution operation corresponds to processing of thinning by every m and executing a convolution operation of a filter coefficient and data interpolated by inserting (n−1) pieces of zero data between respective samples of the second parallel data.

4. The data processor according to claim 3, wherein the filter coefficient is a finite impulse response.

5. The data processor according to claim 3, wherein the filter coefficient is a filter coefficient for compensating transmission characteristics.

6. The data processor according to claim 1, further comprising a compensation circuit compensating waveform distortion of the first parallel data, wherein n/m is larger than 1.

7. The data processor according to claim 1, wherein each of S1 and S3 is a power of 2.

8. The data processor according to claim 1, wherein S1=S3.

9. A communication device comprising:
a reception circuit receiving a transmission signal, converting the transmission signal to a reception signal and outputting the reception signal;
a sampling circuit sampling the reception signal;
a serial/parallel conversion circuit converting a sampled serial data to the first parallel data;
the data processor according to claim 1; and
a demodulation circuit demodulating an output signal of the convolution operation device and outputting a demodulation data.

10. A data processing method performed by a data processor converting a sampling rate to n/m times (n and m are integers equal to or larger than 1), comprising:
a step of inputting first parallel data with number of samples being S1 pieces in synchronism with a first clock, and outputting second parallel data with number of samples being S2=S1×(m/p) pieces (p is an integer equal to or larger than 1) in synchronism with a second clock having a frequency which is p/m times of a frequency of the first clock; and
a step of inputting the second parallel data in synchronism with the second clock, generating third parallel data with number of samples being S3=S2×(n/m) pieces (S3 is an integer equal to or larger than 1) by executing a convolution operation with a coefficient indicating a transmission characteristic to the second parallel data, and outputting the third parallel data in synchronism with the second clock.

* * * * *